US012580153B2

(12) United States Patent
Wang et al.

(10) Patent No.: US 12,580,153 B2
(45) Date of Patent: Mar. 17, 2026

(54) BALANCED RESONATOR SOURCE FOR PLASMA PROCESSING

(71) Applicant: Tokyo Electron Limited, Tokyo (JP)

(72) Inventors: Qiang Wang, Austin, TX (US); Michael Hummel, Austin, TX (US); Zhiying Chen, Austin, TX (US); Peter Lowell George Ventzek, Austin, TX (US); Shyam Sridhar, Austin, TX (US); Mitsunori Ohata, Taiwa-cho (JP)

(73) Assignee: Tokyo Electron Limited, Tokyo (JP)

( * ) Notice: Subject to any disclaimer, the term of this patent is extended or adjusted under 35 U.S.C. 154(b) by 162 days.

(21) Appl. No.: 18/412,042

(22) Filed: Jan. 12, 2024

(65) Prior Publication Data

US 2025/0232952 A1 Jul. 17, 2025

(51) Int. Cl.
*H01J 37/32* (2006.01)

(52) U.S. Cl.
CPC ..... *H01J 37/3211* (2013.01); *H01J 37/32183* (2013.01)

(58) Field of Classification Search
None
See application file for complete search history.

(56) References Cited

U.S. PATENT DOCUMENTS

| | | | | | |
|---|---|---|---|---|---|
| 5,759,280 | A | * | 6/1998 | Holland | H01J 37/321 |
| | | | | | 118/723 I |
| 5,965,034 | A | | 10/1999 | Vinogradov et al. | |

| | | | | |
|---|---|---|---|---|
| 6,225,746 | B1 * | 5/2001 | Wickramanayaka | H05H 1/46 |
| | | | | 315/111.41 |
| 6,259,209 | B1 | 7/2001 | Bhardwaj et al. | |
| 9,313,872 | B2 | 4/2016 | Yamazawa et al. | |
| 9,953,811 | B2 * | 4/2018 | Yamazawa | H01J 37/32174 |
| 10,032,604 | B2 * | 7/2018 | Dhindsa | H01J 37/32082 |

(Continued)

FOREIGN PATENT DOCUMENTS

| | | | |
|---|---|---|---|
| EP | 0838839 | B1 | 5/2008 |
| JP | 2010519448 | A | 6/2010 |

(Continued)

OTHER PUBLICATIONS

US 11,335,544 B2, 05/2022, Inoue et al. (withdrawn)

(Continued)

*Primary Examiner* — Srinivas Sathiraju
(74) *Attorney, Agent, or Firm* — Slater Matsil, LLP

(57) ABSTRACT

According to an embodiment, a plasma processing system is proposed. The plasma processing system includes a plasma chamber; an RF source configured to generate a forward RF wave; an impedance matching circuit coupled to the RF source, the impedance matching circuit configured to provide matching for the RF source; a balun having unbalanced terminals coupled to the impedance matching circuit; and a resonant antenna configured to generate plasma within the plasma chamber, the resonant antenna being a spiral resonant antenna with an electrical length corresponding to a half-wavelength of a frequency of the forward RF wave, the resonant antenna comprising: a first tap along the spiral resonant antenna coupled to a first balanced terminal of the balun and a second tap along the spiral resonant antenna coupled to a second balanced terminal of the balun.

20 Claims, 10 Drawing Sheets

(56) References Cited

U.S. PATENT DOCUMENTS

| | | | | |
|---|---|---|---|---|
| 10,056,231 | B2 * | 8/2018 | Long | H01J 37/32183 |
| 10,224,180 | B2 * | 3/2019 | Lubomirsky | H01J 37/3178 |
| 10,242,845 | B2 * | 3/2019 | Tan | C23C 16/0245 |
| 10,354,838 | B1 * | 7/2019 | Mopidevi | H01J 37/32183 |
| 10,685,810 | B2 * | 6/2020 | Mopidevi | H01J 37/32183 |
| 11,114,284 | B2 * | 9/2021 | Collins | C23C 16/4584 |
| 11,251,021 | B2 | 2/2022 | Ventzek et al. | |
| 11,569,070 | B2 * | 1/2023 | Sekiya | H01L 21/3065 |
| 11,600,466 | B2 * | 3/2023 | Tanabe | H01J 37/32577 |
| 11,600,469 | B2 * | 3/2023 | Takeda | H01J 37/32568 |
| 11,784,030 | B2 * | 10/2023 | Takeda | H01J 37/32568 |
| | | | | 315/111.21 |
| 11,961,710 | B2 * | 4/2024 | Inoue | H01J 37/32706 |
| 12,322,580 | B2 * | 6/2025 | Di Liberto | H01J 37/32926 |
| 12,394,600 | B2 * | 8/2025 | Wang | H01Q 5/10 |
| 2002/0189763 | A1 | 12/2002 | Kwon | |
| 2007/0245959 | A1 * | 10/2007 | Paterson | H01J 37/321 |
| | | | | 118/723 I |
| 2007/0245961 | A1 * | 10/2007 | Paterson | H01J 37/32165 |
| | | | | 118/723 I |
| 2008/0011426 | A1 * | 1/2008 | Chua | H01J 37/321 |
| | | | | 257/E21.279 |
| 2008/0124254 | A1 * | 5/2008 | Choi | H01J 37/3211 |
| | | | | 422/186.29 |
| 2009/0133838 | A1 * | 5/2009 | Miyagawa | H01J 37/321 |
| | | | | 156/345.35 |
| 2010/0213851 | A1 | 8/2010 | Chang Diaz | |
| 2012/0160806 | A1 * | 6/2012 | Godyak | H01J 37/321 |
| | | | | 216/61 |
| 2013/0082599 | A1 * | 4/2013 | Hadidi | H01J 37/08 |
| | | | | 315/111.41 |
| 2013/0192759 | A1 * | 8/2013 | Setsuhara | H01J 37/32357 |
| | | | | 156/345.35 |
| 2013/0200043 | A1 * | 8/2013 | Tojo | H05H 1/46 |
| | | | | 216/68 |
| 2013/0220548 | A1 * | 8/2013 | Setsuhara | C23C 16/507 |
| | | | | 156/345.48 |
| 2014/0150975 | A1 * | 6/2014 | Ebe | H01J 37/3211 |
| | | | | 156/345.48 |
| 2015/0014276 | A1 * | 1/2015 | Yamazawa | H01J 37/3244 |
| | | | | 216/68 |
| 2017/0092467 | A1 * | 3/2017 | Dhindsa | H01L 21/67069 |
| 2017/0372870 | A1 * | 12/2017 | Godyak | H01J 37/3211 |
| 2018/0226223 | A1 * | 8/2018 | Lubomirsky | H01J 37/3002 |
| 2018/0374685 | A1 * | 12/2018 | Collins | H01J 37/32541 |
| 2019/0108974 | A1 * | 4/2019 | Rogers | H01J 37/32 |
| 2019/0198291 | A1 * | 6/2019 | Lubomirsky | H01J 37/321 |
| 2020/0118792 | A1 * | 4/2020 | Mopidevi | H01L 21/67069 |
| 2020/0126763 | A1 * | 4/2020 | Sekiya | H01L 21/3065 |
| 2020/0126764 | A1 * | 4/2020 | Inoue | H01J 37/32183 |
| 2020/0126766 | A1 * | 4/2020 | Sekiya | H01J 37/3255 |
| 2020/0126767 | A1 * | 4/2020 | Takeda | H01J 37/32541 |
| 2021/0005429 | A1 * | 1/2021 | Tanabe | H01J 37/32532 |
| 2021/0127476 | A1 * | 4/2021 | Ebe | H01J 37/321 |
| 2021/0296083 | A1 * | 9/2021 | Kaneko | H01J 37/32568 |
| 2021/0407770 | A1 * | 12/2021 | Moses | H01J 37/32174 |
| 2021/0407771 | A1 * | 12/2021 | Funk | H01J 37/3299 |
| 2021/0407775 | A1 * | 12/2021 | Moses | H01J 37/32082 |
| 2022/0051878 | A1 * | 2/2022 | Sekiya | H01J 37/18 |
| 2022/0068601 | A1 | 3/2022 | Ventzek et al. | |
| 2022/0103141 | A1 * | 3/2022 | Tong | H03F 3/245 |
| 2022/0277932 | A1 * | 9/2022 | Yamawaku | H01L 21/3065 |
| 2023/0054430 | A1 | 2/2023 | Lane | |
| 2023/0352281 | A1 * | 11/2023 | Di Liberto | H01J 37/32926 |
| 2023/0358790 | A1 * | 11/2023 | Coumou | G01R 19/0007 |
| 2024/0347317 | A1 * | 10/2024 | Wang | H01J 37/32146 |
| 2024/0363310 | A1 * | 10/2024 | Wang | H01Q 5/10 |
| 2024/0393373 | A1 * | 11/2024 | Coumou | G01R 19/0007 |
| 2025/0232952 | A1 * | 7/2025 | Wang | H01J 37/32183 |

FOREIGN PATENT DOCUMENTS

| | | | |
|---|---|---|---|
| KR | 20110041352 | A | 4/2011 |
| KR | 101280468 | B1 | 7/2013 |
| KR | 20150122063 | A | 10/2015 |

OTHER PUBLICATIONS

International Search Report and Written Opinion, PCT/US2024/049869, mailed Jan. 3, 2025, Total pages 13.

International Search Report and Written Opinion, PCT/US2024/013044, mailed Jun. 5, 2024, Total pages 10.

* cited by examiner

200

300

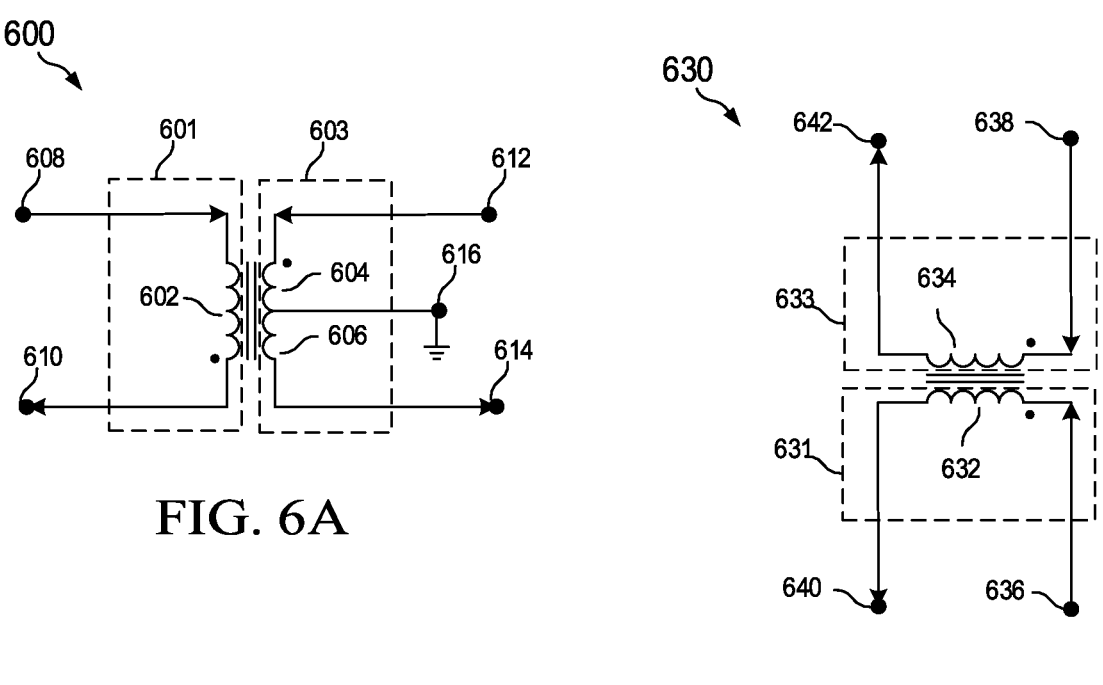
FIG. 6A
FIG. 6B
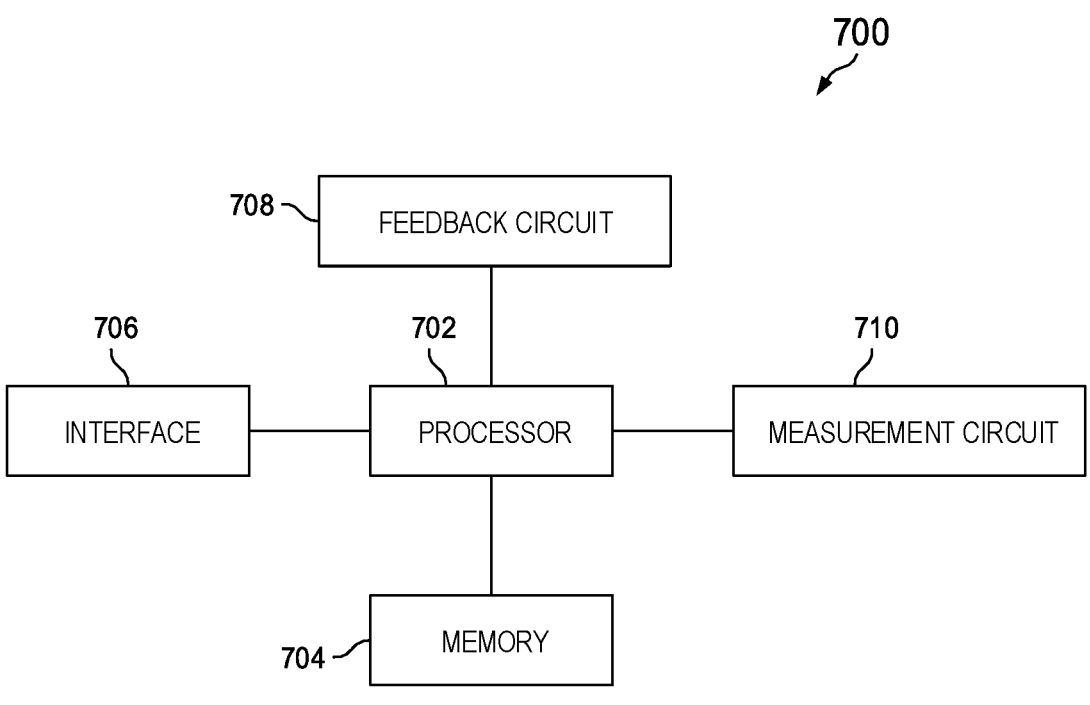
FIG. 7

800

850

900
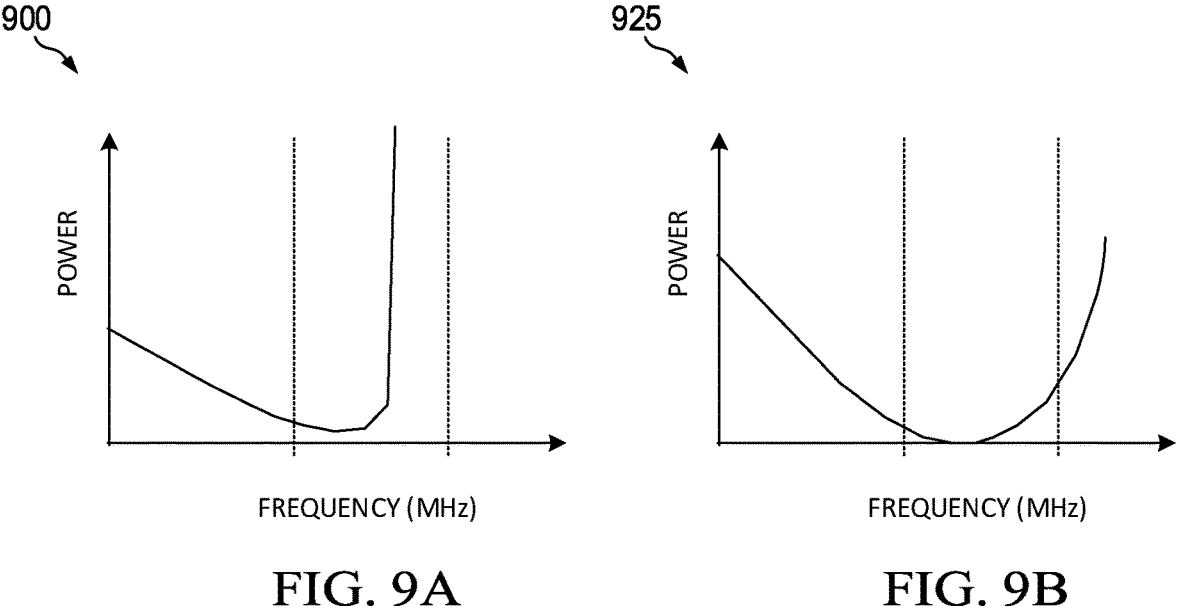
FIG. 9A
925
FIG. 9B
950
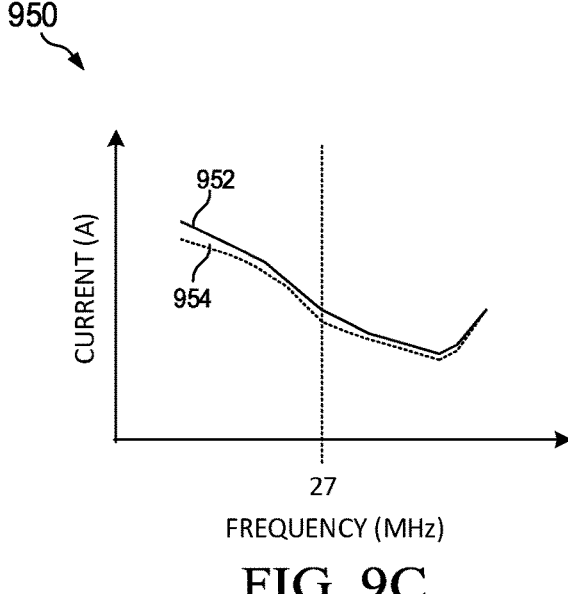
FIG. 9C

1000

1050

1100

1150

1200

1250

BALANCED RESONATOR SOURCE FOR PLASMA PROCESSING

TECHNICAL FIELD

The present disclosure generally relates to plasma processing and, in particular embodiments, to a balanced resonator source for plasma processing.

BACKGROUND

The semiconductor industry widely utilizes plasma processing in the production and construction of high-density microcircuits. This process involves the emission of an electromagnetic wave into a plasma chamber to produce an electromagnetic field. This field induces electron heating within the chamber, leading to the ignition of plasma which then interacts with the substrate through various processes, including etching, deposition, oxidation, and sputtering.

Nonetheless, inconsistencies in the electromagnetic field within the plasma chamber can create a non-uniform treatment of the substrate. This is due to different substrate areas being subjected to varying plasma densities. Therefore, there's a need for a device or system that can enhance the uniformity of the electromagnetic field within a plasma processing system.

SUMMARY

Technical advantages are generally achieved by embodiments of this disclosure, which describe a balanced resonator source for plasma processing.

A first aspect relates to a plasma processing system. The plasma processing system includes a plasma chamber; an RF source configured to generate a forward RF wave; an impedance matching circuit coupled to the RF source, the impedance matching circuit configured to provide matching for the RF source; a balun having unbalanced terminals coupled to the impedance matching circuit; and a resonant antenna configured to generate plasma within the plasma chamber, the resonant antenna being a spiral resonant antenna with an electrical length corresponding to a half-wavelength of a frequency of the forward RF wave, the resonant antenna comprising: a first tap along the spiral resonant antenna coupled to a first balanced terminal of the balun, and a second tap along the spiral resonant antenna coupled to a second balanced terminal of the balun.

A second aspect relates to an apparatus for generating plasma in a plasma processing system. The apparatus includes a plasma chamber; an RF source configured to generate a forward RF wave; an impedance matching circuit coupled to the RF source, the impedance matching circuit configured to provide matching for the RF source; a balun having unbalanced terminals coupled to the impedance matching circuit; a resonant antenna configured to generate plasma within the plasma chamber, the resonant antenna being a spiral resonant antenna with an electrical length corresponding to a half-wavelength of a frequency of the forward RF wave, the resonant antenna comprising: a first tap along the spiral resonant antenna coupled to a first balanced terminal of the balun, and a second tap along the spiral resonant antenna coupled to a second balanced terminal of the balun; a non-transitory memory storage comprising instructions; and a processor in communication with the non-transitory memory storage and coupled to the impedance matching circuit, wherein the instructions, when executed by the processor, cause the processor to provide a matching impedance between the RF source and the resonant antenna.

A third aspect relates to a plasma processing system. The plasma processing system includes a plasma chamber; an RF source configured to generate a forward RF wave; a balun having unbalanced terminals coupled to the RF source; an impedance matching circuit coupled to the RF source and the balun, the impedance matching circuit configured to provide matching for the RF source, the impedance matching circuit comprising: a first variable capacitor arranged between the balun and the RF source, and a first inductor, a second inductor, and a second variable capacitor arranged between the balun and the plasma chamber; and a resonant antenna configured to generate plasma within the plasma chamber, the resonant antenna comprising: a first portion having an electrical length corresponding to a quarter of a wavelength of a frequency of the forward RF wave, the first portion having a first end and a second end, the first end coupled to a first balanced terminal of the balun, a second portion having an electrical length corresponding to the quarter of the wavelength of the frequency of the forward RF wave, the second portion having a first end and a second end, the first end coupled to a second balanced terminal of the balun, and a conductive coupling structure electrically coupling the first end of the first portion to the first end of the second portion.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which:

FIG. 6A is a schematic of an embodiment voltage balun transformer;

FIG. 6B is a schematic of an embodiment current balun transformer;

FIG. 7 is a block diagram of an embodiment processing system;

FIG. 9A is the reflected power in a conventional plasma processing system;

FIG. 9B is an example of the reflected power in a plasma processing system;

FIG. 9C is an example of a first current (I1) and a second current (I2) of a resonant antenna 400;

DETAILED DESCRIPTION OF ILLUSTRATIVE EMBODIMENTS

Figure 1:
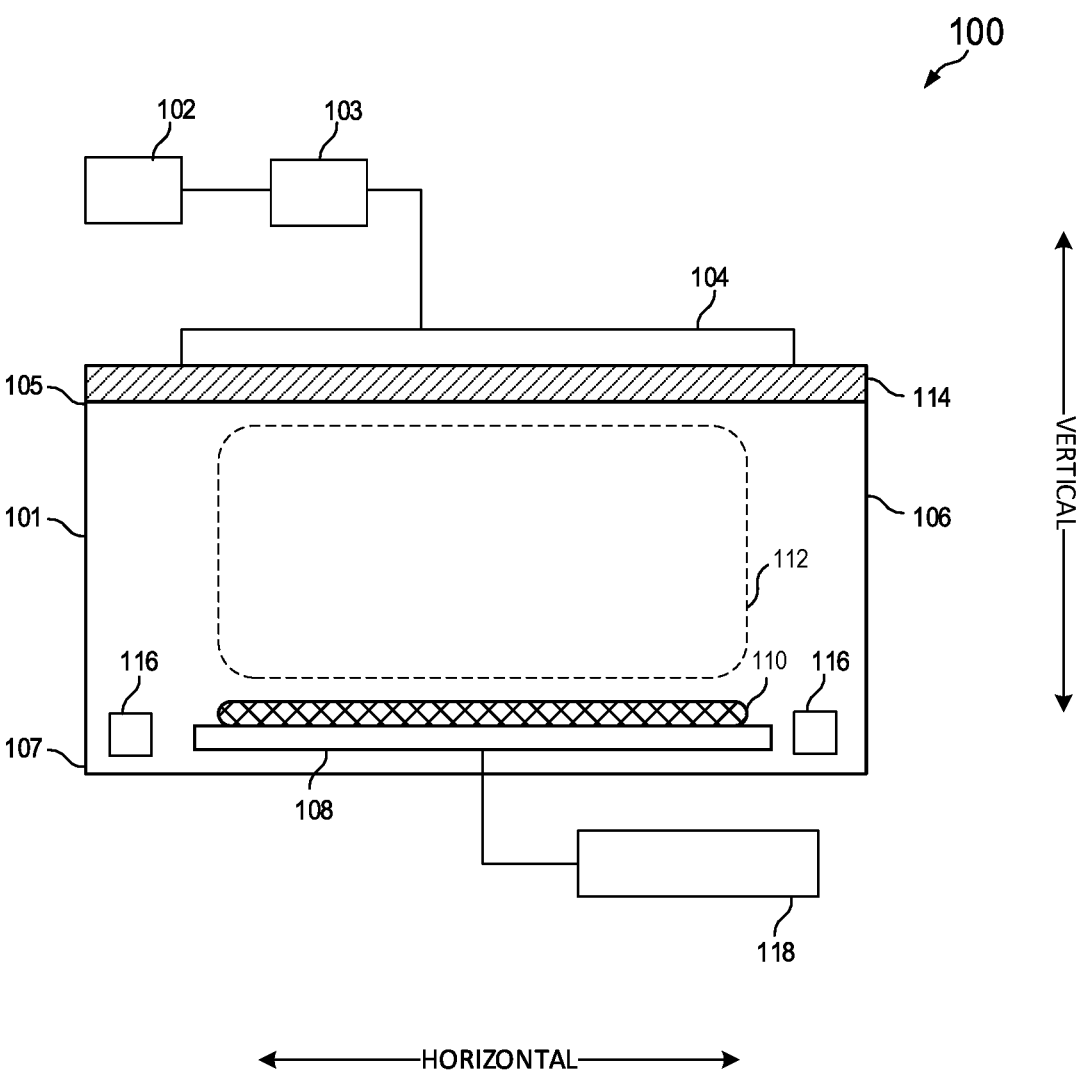
FIG. 1 is a diagram of an embodiment plasma processing system.

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise. Various embodiments are illustrated in the accompanying drawing figures, where identical components and elements are identified by the same reference number, and repetitive descriptions are omitted for brevity.

Variations or modifications described in one of the embodiments may also apply to others. Further, various changes, substitutions, and alterations can be made herein without departing from the spirit and scope of this disclosure as defined by the appended claims.

While inventive aspects are described primarily in the context of resonating in a plasma processing system, the inventive aspects may similarly apply to fields outside the semiconductor industry. Plasma can treat and modify surface properties through functional group addition. For example, to treat surfaces for paint deposits, plasma can convert hydrophobic surfaces to hydrophilic surfaces. Further, the inventive aspects are not limited to plasma. For example, RF can be used to thaw frozen food or dry textiles, food, wood, or the like.

Embodiments of this disclosure advantageously provide a more uniform near-field electromagnetic energy flux (i.e., Poynting vector) than conventional systems, which results in, for example, improved plasma azimuthal uniformity. In embodiments, a balun transformer-based matching network is provided that advantageously delivers balanced currents to each section of the radiating antenna (generating the near-field electromagnetic flux), resulting in improved system stability.

Aspects of the disclosure provide a balanced circuit coupled to a resonant antenna. The resonant antenna includes a single half-wavelength coil. The balanced circuit includes a balanced to unbalanced transformer (i.e., balun) coupled to an impedance-matching network. The combination of the balun and the impedance matching network results in a balanced current in the coil. The improvement in current balance, in comparison to the conventional systems, improves the plasma density uniformity in the plasma chamber.

In embodiments, a plasma processing system includes a plasma chamber, an RF source, an impedance matching circuit, a balun, and a resonant antenna (or coil). The RF source is configured to generate a forward RF wave. The impedance matching circuit is coupled to the RF source and is configured to provide matching for the RF source. The balun includes unbalanced terminals coupled to the impedance matching circuit. The resonant antenna is configured to generate plasma within the plasma chamber and includes a spiral resonant antenna.

In embodiments, the spiral resonant antenna has an electrical length corresponding to a half-wavelength of a frequency of the forward RF wave. The spiral resonant antenna has a first end and a second end. The spiral resonant antenna has multiple taps along its length. A first tap along the length of the spiral resonant antenna is coupled to a first balanced terminal of the balun. A second tap along the length of the spiral resonant antenna is coupled to a second balanced terminal of the balun. In embodiments, the first end and the second end of the spiral resonant antenna are floating. These and further details are discussed in greater detail below.

FIG. 1 illustrates a diagram of an embodiment plasma processing system 100. Plasma processing system 100 includes an RF source 102, a radiating antenna 104, a plasma chamber 106, and, optionally, a dielectric plate 114, which may (or may not) be arranged as shown in FIG. 1. Further, plasma processing system 100 may include additional components not depicted in FIG. 1. The plasma processing system 100, in embodiments, may be housed within an enclosure, which may be a Faraday cage or a solid enclosure.

RF source 102 provides forward RF waves to the radiating antenna 104. The forward RF waves travel through the radiating antenna 104 and are transmitted (i.e., radiated) towards plasma chamber 106. In embodiments, the operating frequency of RF source 102 is set, but not limited to, 1 megahertz (MHz) to 400 MHz. In an embodiment, RF source 102 operates at 13.56 MHz. In an embodiment, RF source 102 operates at 27 MHz. In embodiments, the RF source 102 is pulse-modulated. In such embodiments, the modulation frequency range is between, but not limited to, 10 hertz (Hz) and 1 megahertz (1 MHz), inclusive. In embodiments, the modulation duty ratio range is between 10 and 90%, inclusive.

The plasma chamber 106 may include sidewalls 101, a base 107, and a top cover 105, which may be made of a conductive material, for example, stainless steel or aluminum coated with a film, such as yttria (e.g., YxOy or YxOyFz, etc.), or a film consistent with the process (e.g., carbon, silicon, etc.), or as known to a person of ordinary skill in the art. In embodiments, plasma chamber 106 is cylindrical with a base 107 and a top cover 105 that are circular.

The plasma chamber 106 includes a substrate holder 108 (i.e., chuck). As shown, substrate 110 is placed on substrate holder 108, positioned at the base 107 of the plasma chamber 106, to be processed. Optionally, plasma chamber 106 may include a bias power supply 118 coupled to the substrate holder 108. Optionally, plasma chamber 106 may include one or more pump outlets 116 to remove by-products from plasma chamber 106 through selective control of gas flow rates within. In embodiments, pump outlets 116 are placed near (e.g., below/around the perimeter of) substrate holder 108 and substrate 110. In embodiments, plasma chamber 106 may include additional substrate holders (not shown). In embodiments, the placement of the substrate holder 108 may differ from that shown in FIG. 1. Thus, the quantity and position of the substrate holder 108 are non-limiting.

In embodiments, radiating antenna 104 is separated from the top cover 105 of the plasma chamber 106 by the dielectric plate 114 (i.e., a dielectric window), typically made of a dielectric material such as quartz. Dielectric plate 114 separates the low-pressure environment within the plasma chamber 106 from the external atmosphere. It should be appreciated that radiating antenna 104 can be placed directly adjacent to the top cover 105 of the plasma chamber 106, or radiating antenna 104 can be separated from plasma chamber 106 by air. In embodiments, the dielectric plate 114 is selected to minimize reflections of the RF wave from the plasma chamber 106. In other embodiments, the radiating antenna 104 is embedded within the dielectric plate 114.

In embodiments, radiating antenna 104 radiates an electromagnetic field towards the plasma chamber 106. The radiated electromagnetic field generates a high-density plasma 112. In embodiments, the excitation frequency of the radiating antenna 104 is in the radio frequency range (1-400 MHZ), which is not limiting, and other frequency ranges can similarly be contemplated. For example, inventive aspects disclosed herein equally apply to applications in the microwave frequency range.

In embodiments, the radiating antenna 104 includes a resonant coil. The resonant coil can be circular and coupled to RF source 102 through an intermediary circuit. The resonant antenna is resonant at its resonant frequency with electromagnetic waves fed from the RF source 102.

In embodiments, the resonating coil of the radiating antenna 104 is arranged about a central axis of symmetry. In an embodiment, the central axis of symmetry is perpendicular to the dielectric plate 114. In an embodiment where the dielectric plate 114 is in the shape of a disk, the central axis of symmetry passes through the disk's center.

In embodiments, RF source 102 couples energy to an interface of the radiating antenna 104 to generate the standing electromagnetic waves from the radiating antenna 104. The RF source 102 is coupled to the interface via a transmission line in embodiments. The interface should preferably maintain the same or higher symmetry as the elements of the radiating antenna 104 under rotation about the axis of symmetry.

In an embodiment, the radiating antenna 104 couples RF power from RF source 102 to the plasma chamber 106 to treat substrate 110. In particular, radiating antenna 104 radiates an electromagnetic wave in response to being fed the forward RF waves from the RF source 102. The radiated electromagnetic wave penetrates from the atmospheric side (i.e., radiating antenna 104 side) of the dielectric plate 114 into plasma chamber 106. The radiated electromagnetic wave generates an electromagnetic field within the plasma chamber 106. The generated electromagnetic field ignites and sustains plasma 112 by transferring energy to free electrons within the plasma chamber 106. The plasma 112 can be used to, for example, selectively etch or deposit material on substrate 110.

In FIG. 1, radiating antenna 104 is external to the plasma chamber 106. In embodiments, however, radiating antenna 104 can be placed internally in plasma chamber 106. In embodiments, radiating antenna 104 is a resonant antenna, operating, for example, at its resonant frequency.

In embodiments, the operating frequency of radiating antenna 104 is between 5 and 100 megahertz (MHz). In embodiments, the power delivered by radiating antenna 104 ranges from 10 to 5000 Watts (W)—determined by various factors such as distance from the radiating antenna 104, impedance values, or the like.

Figure 2:
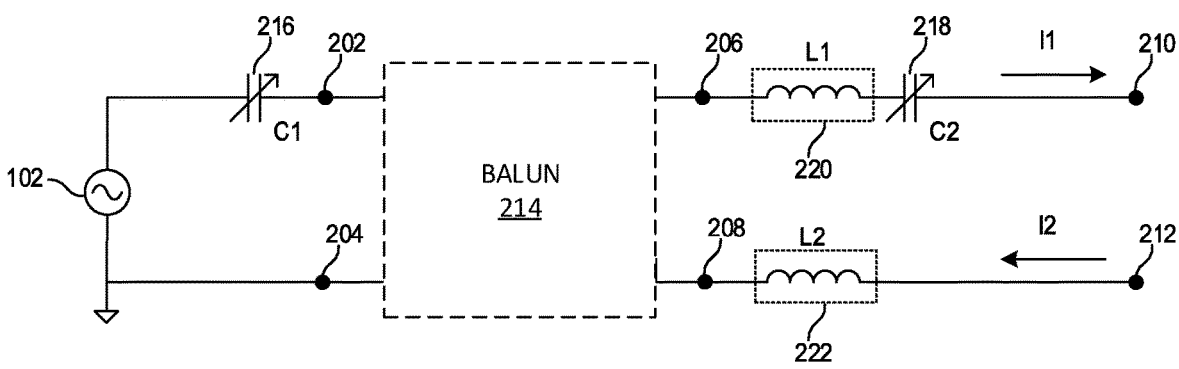
FIG. 2 is a schematic of an embodiment circuit.

FIG. 2 illustrates a schematic of an embodiment circuit 200. Circuit 200 includes the RF source 102, a balun 214 (balanced-to-unbalanced conversion circuit), a first variable capacitor (C1) 216, a second variable capacitor (C2) 218, a first inductor (L1) 220, and a second inductor (L2) 222, and, which may (or may not) be arranged as shown. Circuit 200 may include additional components not shown, such as additional inductors and capacitors. In embodiments, one or both of the first variable capacitor (C1) 216 and the second variable capacitor (C2) 218 are replaced with non-variable capacitors.

RF source 102 includes an RF power supply, which may include a generator circuit. In embodiments, RF source 102, the balun 214, the first variable capacitor (C1) 216, the second variable capacitor (C2) 218, the first inductor (L1) 220, and the second inductor (L2) 222 are coupled via a power transmission line, such as a coaxial cable, or the like. RF source 102 is configured to generate a forward RF wave to the radiating antenna 104. Circuit 200 is couplable at the first terminal 210 and the second terminal 212 to the radiating antenna 104. In embodiments, circuit 200 is couplable to a spiral half-wavelength antenna formed using a single coil.

Generally, when a wave travels through a medium, an impedance discontinuity caused, for example, by a transition from one medium to another, results in a portion of the wave being reflected into the original medium from which the wave is traveling. The parameter used to define this ratio is the reflection coefficient. It is advantageous for RF power from the RF source 102 to be fed to the plasma chamber 106 with minimal reflection and for the reflection coefficient at the impedance discontinuities to be as low as possible.

An impedance associated with the plasma 112, generated in the plasma chamber 106, corresponds to the load of the radiating antenna 104 during its operation. The impedance of the plasma 112 can vary based on, for example, changes in pressure, temperature, increased or decreased gas flow rates, or operating conditions.

In embodiments, the first variable capacitor (C1) 216, the second variable capacitor (C2) 218, the first inductor (L1) 220, and the second inductor (L2) 222 form the impedance matching circuit 103. Matching circuit 103 may include additional components not shown, such as a controller to vary the capacitance of the variable capacitors based on a feedback mechanism. As another example, impedance matching circuit 103 may include one or more transformers, resistor networks, capacitors, inductors (i.e., reactive components), or fixed-length transmission lines, which may be arranged as known in the art.

Typically, the impedance matching circuit 103 (auto or manual) coupled to the radiating antenna 104 is used to minimize losses (i.e., reflected power) in response to changes in the load condition. In embodiments, the components are adjustable (e.g., variable capacitors, etc.) that allow the impedance matching circuit 103 to be updated (i.e., provide a variable impedance) based on the operating condition (e.g., operating frequency) of the plasma processing system 100. In some embodiments, an automatic (i.e., dynamic) tuning algorithm controls the operation and configuration of the impedance matching circuit 103. In embodiments, the impedance matching circuit 103 is manually configured based on the operating condition of the plasma processing system 100.

In embodiments, the first variable capacitor (C1) 216 is arranged between the first unbalanced terminal 202 of the balun 214 and the RF source 102.

In embodiments, the second variable capacitor (C2) 218 and the first inductor (L1) 220 are arranged in series and coupled between the first balanced terminal 206 of the balun 214 and the first terminal 210. Although the second variable capacitor (C2) 218 is arranged between the first inductor (L1) 220 and the first terminal 210 in FIG. 2, in other embodiments, the first inductor (L1) 220 may be arranged between the second variable capacitor (C2) 218 and the first terminal 210.

In embodiments, the first current (I1) from the RF source 102 couples to the radiating antenna 104 at the first terminal 210 and flows through the radiating antenna 104.

In embodiments, the second inductor (L2) 222 is coupled between the second balanced terminal 208 of the balun 214 and the second terminal 212. In embodiments, the second current (I2) from the radiating antenna 104, which flows through the radiating antenna 104, couples to RF source 102 through circuit 200 at the second terminal 212.

In embodiments, the capacitance of the first variable capacitor (C1) 216 is between 1 and 200 picoFarad (pF), inclusive. In embodiments, the capacitance of the second variable capacitor (C2) 218 is between 1 and 200 pF, inclusive. In embodiments, the inductances of the first inductor (L1) 220 and the second inductor (L2) 222 are in the range of 0.1 and 10 microHenry (μH), inclusive.

Balun 214 allows for a differential, balanced RF functional block, for example, the resonant antennas in the present disclosure, to couple to the single-ended, ground-reference (e.g., RF source 102/impedance matching circuit 103) and RF ground. In embodiments, balun 214 and its associated circuits (i.e., including matching circuit 103) are configured to match the impedance at the radiating antenna 104 to the impedance of the RF source 102 which are configured to deliver the RF power to the radiating antenna 104. The first unbalanced terminal 202 and the second unbalanced terminal 204 of the balun 214 are coupled to the RF source 102. The first balanced terminal 206 and the second balanced terminal 208 of the balun 214 are coupled to the radiating antenna 104.

In embodiments, the parameters of the first variable capacitor (C1) 216, the balun 214, the first inductor (L1) 220, the second inductor (L2) 222, and the second variable capacitor (C2) 218 are selected such that the first current (I1) equals the second current (I2).

Figure 3:
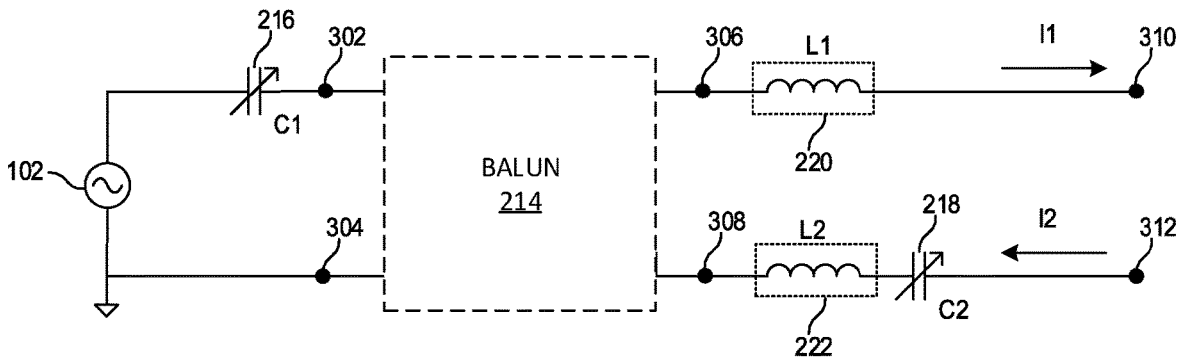
FIG. 3 is a schematic of an embodiment circuit.

FIG. 3 illustrates a schematic of an embodiment circuit 300. Circuit 300 includes the RF source 102, the balun 214, the first variable capacitor (C1) 216, the second variable capacitor (C2) 218, the first inductor (L1) 220, and the second inductor (L2) 222, and, which may (or may not) be arranged as shown. Circuit 300 may include additional components not shown, such as additional inductors and capacitors. In embodiments, one or both of the first variable capacitor (C1) 216 and the second variable capacitor (C2) 218 are replaced with non-variable capacitors. Circuit 300 is couplable at the first terminal 310 and the second terminal 312 to the radiating antenna 104. In embodiments, circuit 300 is couplable to a spiral half-wavelength antenna formed using a single coil.

To keep the discussion concise, the function and structure of the components mentioned concerning circuit 200 in FIG. 2 (with the same element labels) won't be reiterated.

In embodiments, the first variable capacitor (C1) 216, the second variable capacitor (C2) 218, the first inductor (L1) 220, and the second inductor (L2) 222 form the impedance matching circuit 103. In embodiments, the first variable capacitor (C1) 216 is arranged between the first unbalanced terminal 302 of the balun 214 and the RF source 102.

In embodiments, the first inductor (L1) 220 is coupled between the first balanced terminal 306 of the balun 214 and the first terminal 310. In embodiments, the first current (I1) from the RF source 102 couples to the radiating antenna 104 at the first terminal 310 and flows through the radiating antenna 104.

In embodiments, the second variable capacitor (C2) 218 and the second inductor (L2) 222 are arranged in series and coupled between the second balanced terminal 308 of the balun 214 and the second terminal 212. Although the second variable capacitor (C2) 218 is arranged between the second inductor (L2) 222 and the second terminal 312 in FIG. 3, in other embodiments, the second inductor (L2) 222 may be arranged between the second variable capacitor (C2) 218 and the second terminal 312.

In embodiments, the second current (I2) from the radiating antenna 104, which flows through the radiating antenna 104, couples to RF source 102 through circuit 300 at the second terminal 312.

The first unbalanced terminal 202 and the second unbalanced terminal 204 of the balun 214 are coupled to the RF source 102. The first balanced terminal 306 and the second balanced terminal 308 of the balun 214 are coupled to the radiating antenna 104.

Figure 4:
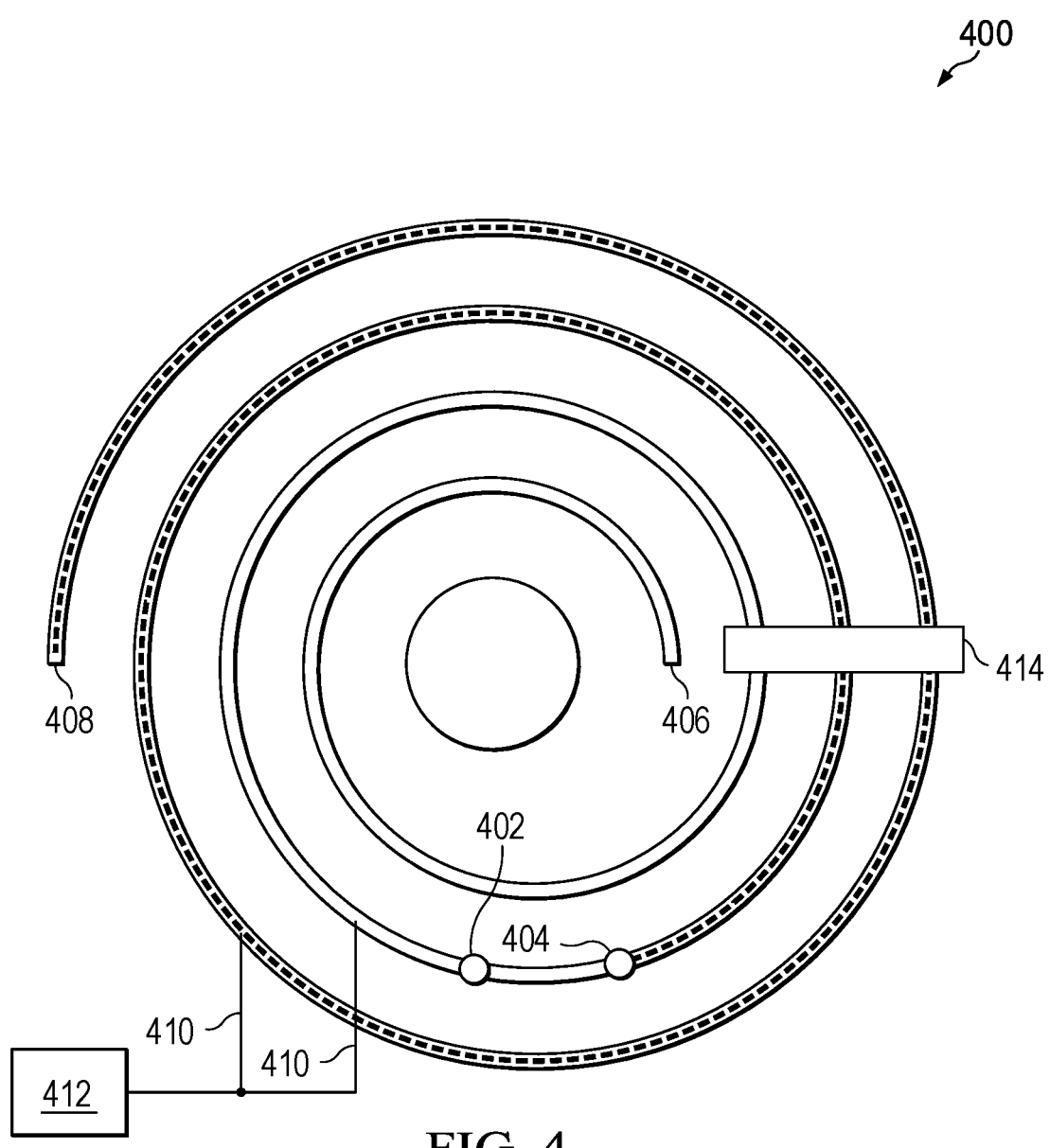
FIG. 4 is an embodiment resonant antenna.

FIG. 4 illustrates an embodiment resonant antenna 400, which may be arranged in the plasma processing system 100 as the radiating antenna 104. Resonant antenna 400 is arranged as a half-wave resonant antenna. Resonant antenna 400 is a spiral conductive structure with an electrical length L substantially equal to a half-resonant frequency wavelength (i.e., half-wavelength). A resonant antenna exhibits resonance at discrete frequencies corresponding to L being equal to a multiple of a quarter wavelength ($\frac{1}{4}\lambda$) or L=n×$\lambda/4$, where n is a whole number. In embodiments, the resonant antenna 400, with n=2, operates at 27 MHz.

Resonant antenna 400 includes multiple taps along its length, which allows a circuit to make physical and electrical contact with it. Two such taps are shown in FIG. 4 as the first terminal 402 and the second terminal 404. In embodiments, the first terminal 402 and second terminal 404 are arranged to be equidistant from the ends of the spiral conductive structure along the length of the resonant antenna 400.

The ends of the resonant antenna 400 are labeled as the third terminal 406 (i.e., at the inner portion of the spiral conductive structure) and the fourth terminal 408 (i.e., at the outer portion of the spiral conductive structure). In embodiments, the third terminal 406 and the fourth terminal 408 are left floating (i.e., open circuit), as shown. In embodiments, the third terminal 406 and the fourth terminal 408 are coupled to a reference ground (not shown).

The first terminal 402 and the second terminal 404 effectively split the resonant antenna 400 into two connected coils: (i) an inner coil portion from the first terminal 402 to the third terminal 406, at one end of the resonant antenna 400 and (ii) an outer coil portion from the second terminal 404 to the fourth terminal 408, at a second end of the resonant antenna 400.

In embodiments, the resonant antenna 400 is coupled to the circuit 200 via taps along the length of the resonant antenna 400. For example, in an embodiment, the first terminal 402 is couplable to the second terminal 212 and the second terminal 404 is couplable to the first terminal 210. In such an embodiment, due to the resonator structure and the standing wave current distribution formed in the antenna 400, when operating at its resonant frequency (e.g., 27 MHz), the max currents in the inner coil portion and outer coil portion are much larger than the first current (I1) (i.e. input current I1), and second current (I2) (i.e. output current), respectively.

As another example, in another embodiment, the first terminal 402 is couplable to the first terminal 210 and the second terminal 404 is couplable to the second terminal 212.

In embodiments, the resonant antenna 400 is coupled to the circuit 300 via taps along the length of the resonant antenna 400. For example, in an embodiment, the first terminal 402 is couplable to the second terminal 312 and the second terminal 404 is couplable to the first terminal 310.

As another example, in another embodiment, the first terminal 402 is couplable to the first terminal 310 and the second terminal 404 is couplable to the second terminal 312.

In embodiments, the RF power frequency is adjusted to the resonant frequency of the antenna so that the first current (I1) equals the second current (I2). It should be appreciated that the first variable capacitor (C1) 216 and the second variable capacitor (C2) 218 provide impedance matching to achieve minimum reflected power.

By balancing the current flowing through the inner coil portion and outer coil portion under the various operating conditions, using, for example, a feedback mechanism and configuring the impedance matching circuit 103, the uniformity of the plasma generated by resonant antenna 400 is increased. Further, the system's operational stability is improved by balancing the currents in the inner and outer coil portions.

Further, by balancing the current flowing through the inner and outer coil portions under the various operating conditions, the maximum voltages at the inner and outer coil portions are equal in amplitude but 180 degrees out-of-phase. Accordingly, the in-phase and the reverse phase portion of the capacitive currents between the coil and the plasma are balanced (i.e., canceled), further resulting in a minimum RF plasma potential.

In embodiments, vertical non-conductive structures 410 (e.g., non-conductive offsets perpendicular to the spiral conductive structure of the resonant antenna 400) are structurally coupled to the resonant antenna 400. In embodiments, horizontal non-conductive structures 414 provide structural support to the resonant antenna 400. The vertical non-conductive structures 410 and the horizontal non-conductive structures 414 may be arranged on any position along the length of the resonant antenna 400. In embodiments, the vertical non-conductive structures 410 are configurable to vertically adjust the plane on which the resonant antenna 400 is arranged with respect (substantially parallel) to the top cover 105 of the plasma chamber 106.

Figure 5:
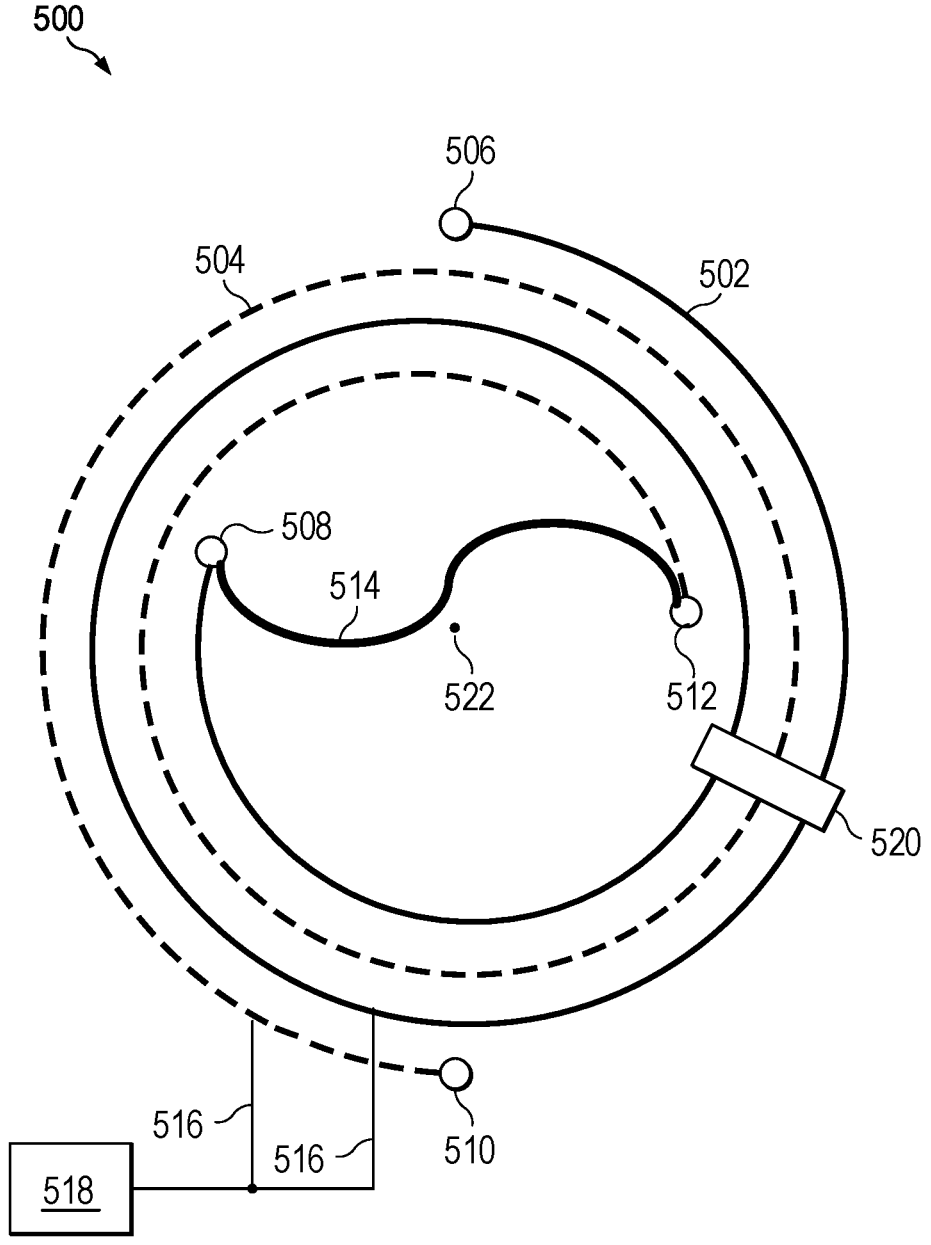
FIG. 5 is an embodiment resonant antenna.

FIG. 5 illustrates an embodiment resonant antenna 500, which may be arranged in the plasma processing system 100 for the radiating antenna 104. In an embodiment, resonant antenna 500 includes a pair of spiral resonant antennas, each configured as a quarter-wavelength resonator. The pair of spiral resonant antennas are electrically and mechanically coupled via a conductive coupling structure, such that the resonant antenna 500 effectively becomes a single spiral half-wavelength resonant antenna. In an embodiment, resonant antenna 500 includes a pair of spiral resonant antennas, each configured as a half-wavelength resonator. The pair of spiral resonant antennas are electrically and mechanically coupled via a conductive coupling structure, such that the resonant antenna 500 effectively becomes a single spiral full-wavelength resonant antenna. In embodiments, the resonant antenna 500 operates at 27 MHz.

The first one of the pair of spiral resonant antennas is the first coil 502 (also referred to as the inner coil). A second one of the pair of spiral resonant antennas is the second coil 504 (also referred to as the outer coil). The first coil 502 and the second coil 504 are shown to be substantially on the same plane and nested within each other. The nested arrangement effectively places each turn of the first coil 502 adjacent to a respective turn of the second coil 504. The first coil 502 and the second coil 504 may have one or more turns to form the respective spiral resonant antenna. Thus, the number of turns for the first coil 502 and the second coil 504 is non-limiting.

The first coil 502 and the second coil 504 are spiral conductive structures. In embodiments, the electrical lengths of the first coil 502 and the second coil 504 are substantially equal to a quarter resonant frequency wavelength (i.e., quarter-wave). In embodiments, the electrical lengths of the first coil 502 and the second coil 504 are substantially equal to a half resonant frequency wavelength (i.e., half-wave).

In embodiments, the first coil 502 and the second coil 504 are arranged symmetrically with respect to a center point 522 defining the spiral structure of each coil. In embodiments, the first coil 502 and the second coil 504 are arranged as planar spiral conductive coils. In embodiments, the first coil 502 and the second coil 504 are intertwined on the same plane configured to radiate the electromagnetic wave.

The first coil 502 includes a first terminal 506 and a second terminal 508. The first terminal 506 is arranged at the outer portion of the resonant antenna 500. The second terminal 508 is arranged at the inner portion of the resonant antenna 500.

The second coil 504 includes a third terminal 510 and a fourth terminal 512. The third terminal 510 is arranged at the outer portion of the resonant antenna 500. The fourth terminal 512 is arranged at the inner portion of the resonant antenna 500.

A conductive coupling structure 514 electrically couples the second terminal 508 of the first coil 502 to the fourth terminal 512 of the second coil 504. Accordingly, the first coil 502, the second coil 504, and the conductive coupling structure 514 form a single spiral half-wavelength resonant antenna, in one embodiment, or a single spiral full-wavelength resonant antenna in other embodiments.

A quarter-wavelength resonator exhibits resonance at discrete frequencies corresponding to L (the electrical length of the first coil 502 and the second coil 504). L equals to a multiple of one-quarter of a wavelength ($\lambda$) or $L=n \times \lambda/4$, where n is a whole number. Here, the frequency corresponds to the frequency of the RF wave directed from the RF source 102 couplable to the resonant antenna 500.

In embodiments, the physical length of the first coil 502 is substantially equal to the physical length of the second coil 504. In embodiments, the physical length of the first coil 502 is different from that of the second coil 504.

In embodiments, the first terminal 506 and the third terminal 510 are left floating (i.e., open circuit), as shown. In embodiments, the first terminal 506 and the third terminal 510 are coupled to a reference ground (not shown).

In embodiments, the resonant antenna 500 is coupled to the circuit 200 via the second terminal 508 and the fourth terminal 512, at one end of the first coil 502 and the second coil 504, respectively. For example, in an embodiment, the second terminal 508 is couplable to the first terminal 210 and the fourth terminal 512 is couplable to the second terminal 212. In such an embodiment, due to the resonator structure and the standing wave current distribution formed in the antenna 500, when operating at its resonant frequency (e.g., 27 MHz), the max currents in the inner coil portion and outer coil portion are much larger than the first current (I1) (i.e. input current I1), and second current (I2) (i.e. output current), respectively. When the first current (I1) is balanced with the second current (I2), the max current in the inner coil portion equals the max current in the outer coil portion.

As another example, in another embodiment, the second terminal 508 is couplable to the second terminal 212 and the fourth terminal 512 is couplable to the first terminal 210.

In embodiments, the parameters of the first variable capacitor (C1) 216, the balun 214, the first inductor (L1) 220, the second inductor (L2) 222, and the second variable capacitor (C2) 218 in circuit 200 and circuit 300 are selected, and modifiable, such that the first current (I1) equals the second current (I2). The RF power frequency is adjusted to the resonant frequency of the antenna so that the first current (I1) equals the second current (I2). It should be appreciated that the first variable capacitor (C1) 216 and the second variable capacitor (C2) 218 provide impedance matching to achieve minimum reflected power.

By balancing the current flowing through the first coil 502 and the second coil 504, under the various operating conditions, using, for example, a feedback mechanism and configuring the impedance matching circuit 103, the uniformity of the plasma generated by resonant antenna 500 is increased. Further, the system's operational stability is improved by balancing the currents in the inner and outer coil portions.

Further, by balancing the current flowing through the inner and outer coil portions under the various operating conditions, the maximum voltages at the inner and outer coil portions are equal in amplitude but 180 degrees out-of-phase. Accordingly, the in-phase and the anti-phase portion of the capacitive currents between the coil and the plasma are balanced (i.e., canceled), further resulting in a minimum RF plasma potential.

In embodiments, the resonant antenna 500 is arranged on a plane parallel to the top cover 105 of the plasma chamber 106. In embodiments, the resonant antenna 500 is coupled to a mechanical structure 518 (e.g., an actuator) that allows the resonant antenna 500 to be vertically adjusted with respect to the top cover 105 while remaining parallel to the top cover 105. In embodiments, the parameters of the first variable capacitor (C1) 216, the balun 214, the first inductor (L1) 220, the second inductor (L2) 222, and the second variable capacitor (C2) 218 in circuit 200 and circuit 300 are selected, and modifiable, based on a change at the load in response to the adjustment of the resonant antenna 500.

In embodiments, the first coil 502 and the second coil 504 are arranged in a nested configuration. In embodiments, the first coil 502 and the second coil 504 are arranged in an interwoven (i.e., braided) configuration but electrically isolated, apart from the coupling through the conductive coupling structure 514. In embodiments, the second coil 504 is arranged such that a radial distance from any point, along the length of the second coil 504, is equally separated (i.e., equidistance) from the first coil 502.

In embodiments, the first coil 502 and the second coil 504 are substantially on the same plane. In embodiments, the first coil 502 and the second coil 504 are on different planes that are substantially perpendicular. In embodiments, the first coil 502 and the second coil 504 have a common center point 522 at the center of the spiral conductive structure. In embodiments, the first coil 502 and the second coil 504 are conical coils arranged such that the conical coils have a first common plane at the base and a second common plane at the top. In embodiments, the first coil 502 and the second coil 504 are cylindrical coils arranged such that the cylindrical coils have a first common plane at the base and a second common plane at the top.

In embodiments, the first terminal 506 and the third terminal 510 are substantially on a first plane and 180 degrees offset. In embodiments, the second terminal 508 and the fourth terminal 512 are substantially on a second plane and 180 degrees offset. In embodiments, the first terminal 506 is offset from the second terminal 508 in the first coil 502 such that the electrical length of the first coil 502 corresponds to a quarter or half resonant frequency wavelength. In embodiments, the third terminal 510 is offset from the fourth terminal 512 in the second coil 504 such that the electrical length of the second coil 504 corresponds to a quarter or half resonant frequency wavelength. In embodiments, the first and the second planes are the same planes. In embodiments, the first and second planes are offset from each other with a distance that results in a quarter or half-wave electrical length for the first coil 502 and the second coil 504.

In embodiments, the first coil 502 and the second coil 504 have a design corresponding to an arc or a spiral, for example, an Archimedean, an equiangular, an Euler, a Cornu, a Clothoid, a Cotes, a Fermat, a parabolic, a lituus, a Poinsot, a reciprocal, a hyperbolic, a logarithmic, or a sinusoidal spiral forming a spiral antenna. However, the design of the resonant antenna 500 is non-limiting. As another example, the resonant antenna 500 can be a single-coil arc plate, a double-coil arc plate, or a unibody arc plate.

In embodiments, each of the first coil 502 and the second coil 504 is a solid conductive plate with cutouts to form the respective coils. In embodiments, a non-conductive structure (e.g., a non-conductive plate with cutouts to hold the first coil 502 and the second coil 504) provides structural support to arrange the first coil 502 within the inner radius of the second coil 504.

In embodiments, vertical non-conductive structures 516 (e.g., non-conductive offsets perpendicular to the first coil 502 and the second coil 504) are structurally coupled to the first coil 502 and the second coil 504. In embodiments, horizontal non-conductive structures 520 provide structural support to separate the first coil 502 from the second coil 504 at an equidistance along the spiral structures.

The vertical non-conductive structures 516 and the horizontal non-conductive structures 520 may be arranged on any position along the length of the first coil 502, the second coil 504, or both. In embodiments, the vertical non-conductive structures 516 are configurable to vertically adjust the plane on which the resonant antenna 500 is arranged with respect (substantially parallel) to the top cover 105 of the plasma chamber 106. In embodiments, the first coil 502 and the second coil 504 include a wire arranged in a spiral configuration. The first end of the wire of each of the first coil 502 and the second coil 504 is couplable to a respective terminal of circuit 200 or circuit 300.

FIG. 6A illustrates a schematic of an embodiment voltage balun transformer 600, which may be arranged as the balun 214. The voltage balun transformer 600 includes a first winding 601 and a second winding 603. In embodiments, first winding 601 includes a first coil 602, and second winding 603 includes a second coil 604 and a third coil 606. A first unbalanced terminal 608 and a second unbalanced terminal 610 of the voltage balun transformer 600, at the ends of the first coil 602, are couplable to the impedance matching circuit 103. The second coil 604 and the third coil 606 are couplable to the radiating antenna 104 at balanced terminals 612 and 614, respectively. In embodiments, one of the unbalanced terminals 608 or 610 is coupled to a reference ground.

In embodiments, the first coil 602 has the same number of turns as the combined number of turns in the second coil 604 and the third coil 606. In embodiments, the second coil 604 and the third coil 606 have the same number of turns. In embodiments, the second coil 604 and the third coil 606 share an iron core. As shown, the shared node 616 between the second coil 604 and the third coil 606 is coupled to the reference ground. However, it should be understood that the shared node 616, in embodiments, may also be floating.

FIG. 6B illustrates a schematic of an embodiment current balun transformer 630, which may be arranged as the balun 214. The current balun transformer 630 includes a first winding 631 and a second winding 633. In embodiments, first winding 631 includes a first coil 632 and the second winding 633 includes a second coil 634. A first unbalanced terminal 640 and a second unbalanced terminal 642 of the current balun transformer 630 at the ends of the first coil 632 and the second coil 634, respectively, are couplable to the impedance matching circuit 103. The first coil 632 and the second coil 634 are couplable to the radiating antenna 104 at balanced terminals 636 and 638, respectively. In embodiments, one of the unbalanced terminals 640 or 642 is coupled to a reference ground. In embodiments, the first coil 632 has the same number of turns as the second coil 634.

FIG. 7 illustrates a block diagram of an embodiment processing system 700, which may be coupled to the plasma processing system 100. As shown, the processing system 700 includes a processor 702, a memory 704, an interface 706, an optional feedback circuit 708, and an optional measurement circuit 710, which may (or may not) be arranged as shown. The processing system 700 may include additional components not depicted, such as long-term storage (e.g., non-volatile memory, etc.), measurement devices, and the like. Although the processing system 700 is shown to have one of each component (i.e., the processor 702, the memory 704, etc.), the number of components is not limiting and greater numbers are similarly contemplated in other embodiments. In such embodiments, the task performed by the component disclosed herein may be spread through these additional components.

Processor 702 may be any component or collection of components adapted to perform computations or other processing-related tasks. Memory 704 may be any component or collection of components adapted to store programming or instructions for execution by the processor 702. In an embodiment, memory 704 includes a non-transitory computer-readable medium.

Interface 706 may be any component or collection of components that allow the processor 702 to communicate with other devices/components or a user. For example, interface 706 may be adapted to communicate data, control, or management messages from processor 702 to a structure or circuit coupled to an actuator to adjust the vertical position of the radiating antenna 104 with respect to the plasma chamber or to adjust the configuration of the impedance matching circuit 103 and balun 214 based on instructions or configurations stored in memory 704. As another example, interface 706 may be adapted to allow a user or device (e.g., personal computer (PC), etc.) to interact/communicate with the processing system 700.

The feedback circuit 708 may be used to receive measurements from the measurement circuit 710 to automatically or manually change, through processor 702, the configuration of the impedance matching circuit 103 and balun 214 in the plasma processing system 100. The measurement circuit 710 may be used to measure, for example, the plasma stability, pressure, ignition stability, density, or the like.

Figure 8A:
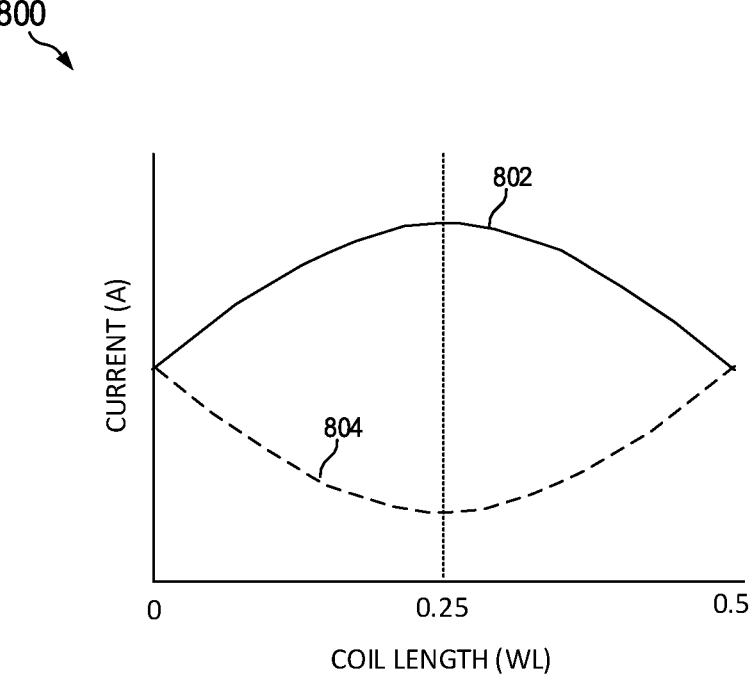
FIGS. 8A-B is an example of the distribution of current and voltages.
Figure 8B:
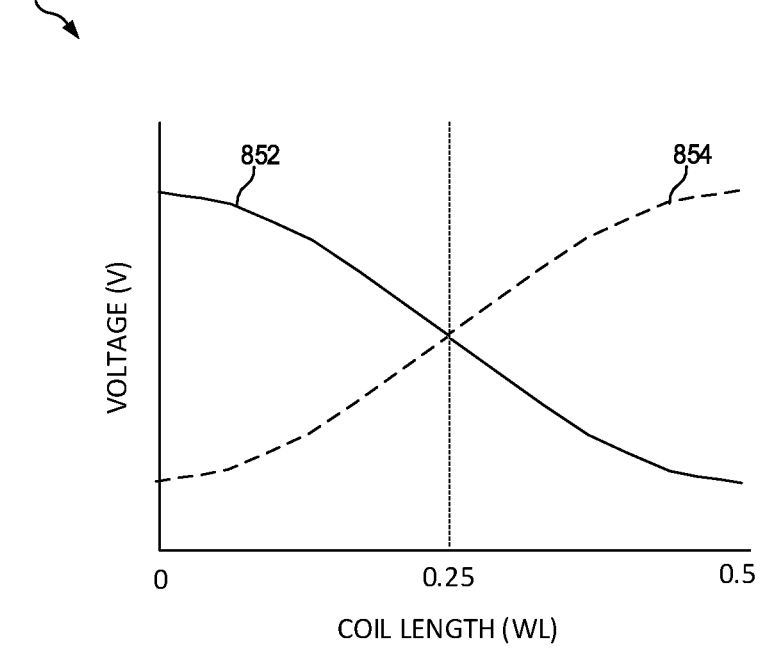

FIGS. 8A-B illustrate an example distribution of the current and voltages, respectively, in a plasma processing system using the circuit 200 and the resonant antenna 400. FIG. 8A illustrates the distribution of the current in the coil of the resonant antenna 400 along its length, which is normalized based on its wavelength. FIG. 8B illustrates the voltage distribution in the coil of the resonant antenna 400 along its length, also normalized based on its wavelength.

The current distribution and the voltage distribution along the resonant antenna 400 have a current-standing-wave (CSW) and a voltage-standing-wave (VSW) pattern, respectively. The current distribution 802 and the voltage distribution 852 correspond to the current distribution along the coil at a first phase of one RF period. The current distribution 804 and the voltage distribution 854 correspond to the current distribution along the coil at a second phase of one RF period (which is a 180-degree difference from the first phase).

As shown, the current distribution 802 and the current distribution 804 along the coil are at their maximum at the center and minimum at the edge. In contrast, the voltage distribution 852 and the voltage distribution 854 along the coil are at their minimum at the center and maximum at the edge.

Further, by balancing the current flowing through the inner and outer coil portions under the various operating conditions, the maximum voltages at the inner and outer coil portions are equal in amplitude but 180 degrees out-of-phase. Accordingly, the in-phase and the anti-phase portion of the capacitive currents between the coil and the plasma are balanced (i.e., canceled), further resulting in a minimum RF plasma potential.

FIG. 9A illustrates the reflected power 900 in the conventional plasma processing system (using resonant antenna 400 along) without the proposed circuit 200 or 300 in combination with the resonant antenna 400 or 500. FIG. 9B illustrates an example of the reflected power 925 in a plasma processing system using the circuit 200 and the resonant antenna 400. FIG. 9C illustrates an example of the first current (I1) 952 flowing into the resonant antenna 400 and an example of the second current (I2) 954 flowing out of the resonant antenna 400. The pressure of the Argon (Ar) gas within the plasma processing system 100 in FIGS. 9A-C is at 20 milliTorr (mT).

As shown, the reflected power 900 in the conventional resonant antenna operated plasma processing system, while operating within the dashed frequency range in FIG. 9A, rapidly increases right after the frequency corresponding to the minimum reflected power, resulting in an unstable frequency tuning window. This sudden increase in the reflected power, for example, up to 120 watts, within the operating frequency range is typically called a frequency tuning cliff, which can cause system instability under continuous waves or pulsed power operations.

In contrast, by utilizing the impedance matching circuit 103, as detailed in circuit 200, in combination with the balun 214, the reflected power 925 in the plasma processing system using circuit 200 and the resonant antenna 400 exhibits a much smoother transition with respect to the frequency tuning range, which significantly improves the stability of the plasma processing system within the frequency tuning window.

In FIG. 9C, the first current (I1) 952 flowing into the resonant antenna 400 is substantially equal to the second current (I2) 954 flowing out of the resonant antenna 400 at the resonant frequency.

Figure 10A:
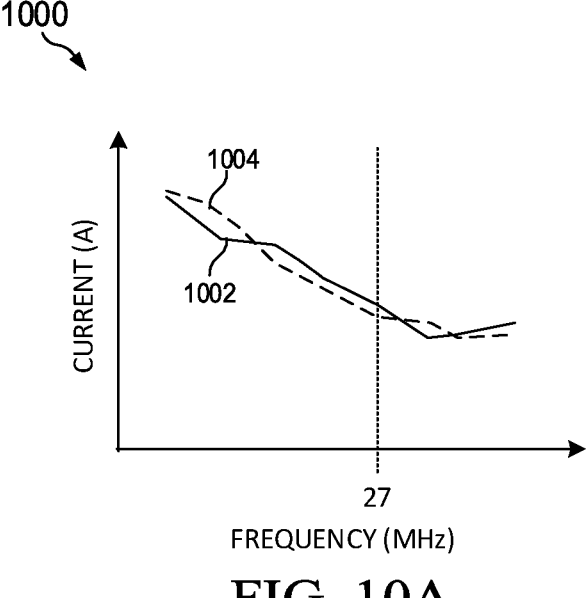
FIG. 10A is an example of a first current (I1) and a second current (I2) of a resonant antenna 400.
Figure 10B:
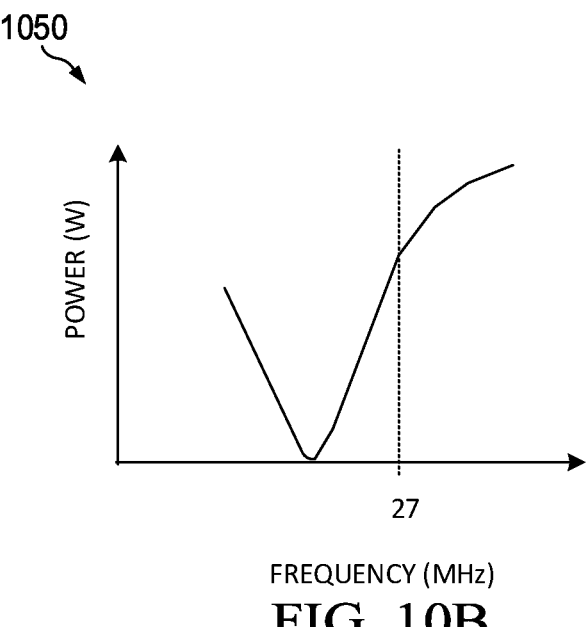
FIG. 10B is an example of the reflected power in a plasma processing system.

For the same system as used in FIG. 9B, FIG. 10A illustrates an example of the first current (I1) 1002 flowing into the resonant antenna 400 and an example of the second current (I2) 1004 flowing out of the resonant antenna 400 at an Ar pressure of 0.3 (mT). FIG. 10B illustrates an example of the reflected power 1050 in a plasma processing system using circuit 200 and the resonant antenna 400 while operating at an Ar pressure of 0.3 mT (i.e. similar to the condition in FIG. 10A).

By utilizing the impedance matching circuit 103, as detailed in circuit 200, in combination with the balun 214, the reflected power 1050 in the plasma processing system using circuit 200 and the resonant antenna 400 exhibits a smooth transition with respect to the frequency tuning range of the system at very low-pressure conditions, which significantly improves the stability of the plasma processing system within the frequency tuning window. The plasma processing system, when using resonant antenna 400 along, usually cannot achieve stable operation at less than 10 mT pressure conditions. Thus, the circuit 200 and the resonant antenna 400 (and likewise circuit 300 in combination with the resonant antenna 400) may enable a wider operation window regarding pressure conditions.

Figure 11A:
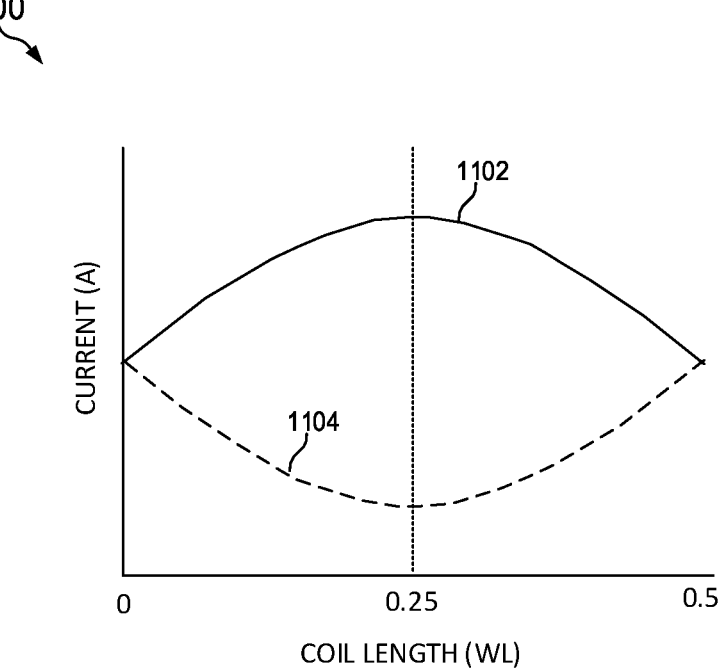
FIGS. 11A-B are examples of the distribution of current and voltages.
Figure 11B:
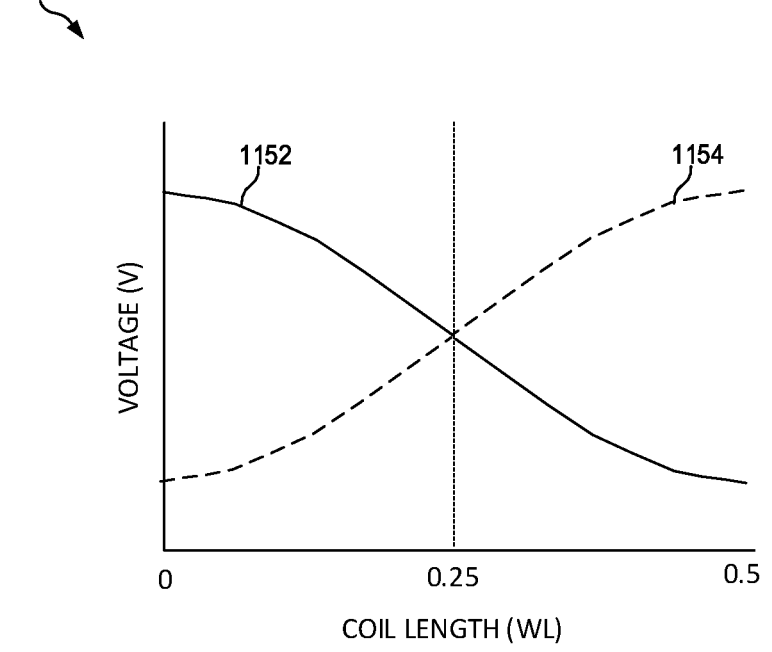

FIGS. 11A-B illustrate an example distribution of the current and voltages, respectively, in a plasma processing system using the circuit 200 and the resonant antenna 500 where the first terminal 506 and the third terminal 510 are floating. The current and the voltage distributions are illustrated for the resonant antenna 500 configured as a half-wavelength resonant antenna.

FIG. 11A illustrates the distribution of the current in the coil of the resonant antenna 500 along its length, which is normalized based on its wavelength. FIG. 11B illustrates the voltage distribution in the coil of the resonant antenna 500 along its length, also normalized based on its wavelength.

The current distribution and the voltage distribution along the resonant antenna have a current-standing-wave (CSW) and a voltage-standing-wave (VSW) pattern, respectively. The current distribution 1102 and the voltage distribution 1152 correspond to the current distribution along the coil at a first phase of one RF period. The current distribution 1104 and the voltage distribution 1154 correspond to the current distribution along the coil at a second phase of one RF period (which is a 180-degree difference from the first phase).

As shown, the current distribution 1102 and the current distribution 1104 along the coil are at their maximum at the center and minimum at the edge. In contrast, the voltage distribution 1152 and the voltage distribution 1154 along the coil are at their minimum at the center and maximum at the edge.

Further, by balancing the current flowing through the inner and outer coil portions under the various operating conditions, the maximum voltages at the inner and outer coil portions are equal in amplitude but 180 degrees out-of-phase. Accordingly, the in-phase and the reverse-phase portion of the capacitive currents between the coil and the plasma are balanced (i.e., canceled), further resulting in a minimum RF plasma potential.

Figure 12A:
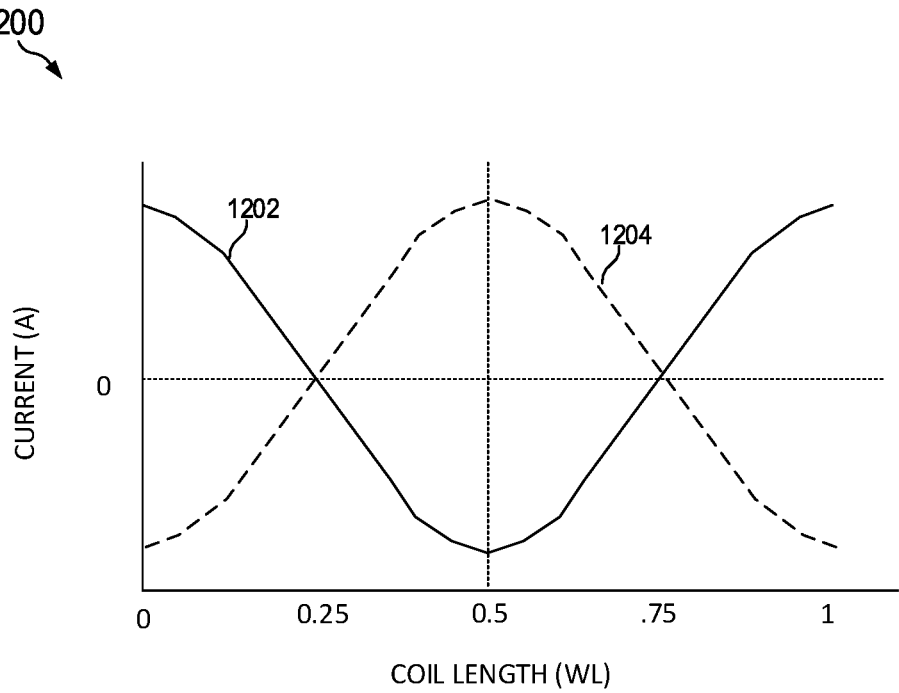
FIGS. 12A-B are examples of the distribution of current and voltages.
Figure 12B:
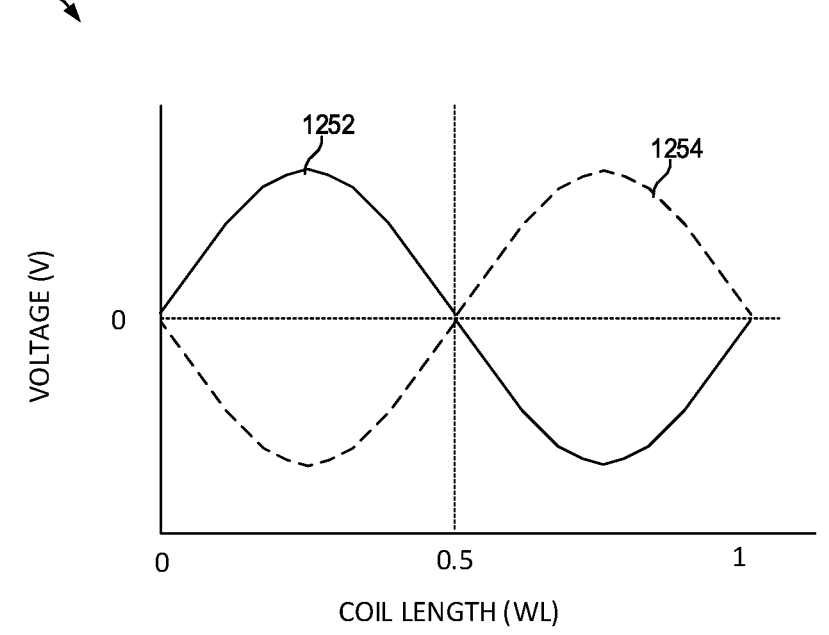

FIGS. 12A-B illustrate an example distribution of the current and voltages, respectively, in a plasma processing system using circuit 200 and the resonant antenna 500, where the first terminal 506 and the third terminal 510 are coupled to the reference ground. The current and the voltage distributions are illustrated for the resonant antenna 500 configured as a full-wavelength resonant antenna.

FIG. 12A illustrates the distribution of the current in the resonant antenna/coil of the resonant antenna 500 along its length, which is normalized based on its wavelength. FIG. 12B illustrates the voltage distribution in the coil of the resonant antenna 500 along its length, also normalized based on its wavelength.

The current distribution and the voltage distribution along the resonant antenna/coil have a current-standing-wave (CSW) and a voltage-standing-wave (VSW) pattern, respectively. The current distribution 1202 and the voltage distribution 1252 correspond to the current distribution along the coil at a first phase of one RF period. The current distribution 1204 and the voltage distribution 1254 correspond to the current distribution along the coil at a second phase of one RF period (which is a 180-degree difference from the first phase).

As shown, the current distribution 1202 is at its maximum amplitude at the edge and center, and its minimum amplitudes at ¼ and ¾ WL positions. The current distribution 1204 has the same positions for maximum and minimum as for 1202. The voltage distribution 1252 is at its maximum amplitude at the quarter of the WL and three quarters of WL position, its minimum amplitude at the edge and the center positions. The voltage distribution 1254 is similar to 1252.

Further, by balancing the current flowing through the inner and outer coil portions under the various operating conditions, the maximum voltages at the inner and outer coil portions are equal in amplitude but 180 degrees out-of-phase. Accordingly, the in-phase and the reverse-phase portion of the capacitive currents between the coil and the plasma are balanced (i.e., canceled), resulting in a minimum RF plasma potential.

A first aspect relates to a plasma processing system. The plasma processing system includes a plasma chamber; an RF source configured to generate a forward RF wave; an impedance matching circuit coupled to the RF source, the impedance matching circuit configured to provide matching for the RF source; a balun having unbalanced terminals coupled to the impedance matching circuit; and a resonant antenna configured to generate plasma within the plasma chamber, the resonant antenna being a spiral resonant antenna with an electrical length corresponding to a half-wavelength of a frequency of the forward RF wave, the resonant antenna comprising: a first tap along the spiral resonant antenna coupled to a first balanced terminal of the balun, and a second tap along the spiral resonant antenna coupled to a second balanced terminal of the balun.

In a first implementation form of the plasma processing system according to the first aspect as such, the impedance matching circuit includes a first variable capacitor arranged between the balun and the RF source; a first inductor arranged between the first balanced terminal of the balun and the first tap; a second inductor arranged between the second balanced terminal of the balun and the second tap; and a second variable capacitor arranged between the first balanced terminal of the balun and the first tap, the second variable capacitor being in series with the first inductor.

In a second implementation form of the plasma processing system according to the first aspect as such or any preceding implementation form of the first aspect, the impedance matching circuit includes a first variable capacitor arranged between the balun and the RF source; a first inductor arranged between the first balanced terminal of the balun and the first tap; a second inductor arranged between the second balanced terminal of the balun and the second tap; and a second variable capacitor arranged between the second balanced terminal of the balun and the second tap, the second variable capacitor being in series with the second inductor.

In a third implementation form of the plasma processing system according to the first aspect as such or any preceding implementation form of the first aspect, an operating frequency of the RF source is 27 megahertz (MHz).

In a fourth implementation form of the plasma processing system according to the first aspect as such or any preceding implementation form of the first aspect, the spiral resonant antenna includes a first portion having an electrical length corresponding to a quarter of a wavelength of a frequency of the forward RF wave, the first portion having a first end and a second end, the first end coupled to the first balanced terminal of the balun; a second portion having an electrical length corresponding to the quarter of the wavelength of the frequency of the forward RF wave, the second portion having a first end and a second end, the first end coupled to the second balanced terminal of the balun; and a conductive coupling structure electrically coupling the first end of the first portion to the first end of the second portion.

In a fifth implementation form of the plasma processing system according to the first aspect as such or any preceding implementation form of the first aspect, the first portion and the second portion are arranged in a symmetrically nested configuration having a same center point.

In a sixth implementation form of the plasma processing system according to the first aspect as such or any preceding implementation form of the first aspect, the second end of the first portion and the second end of the second portion are coupled to a reference ground.

In a seventh implementation form of the plasma processing system according to the first aspect as such or any preceding implementation form of the first aspect, the second end of the first portion and the second end of the second portion are floating.

A second aspect relates to an apparatus for generating plasma in a plasma processing system. The apparatus includes a plasma chamber; an RF source configured to generate a forward RF wave; an impedance matching circuit coupled to the RF source, the impedance matching circuit configured to provide matching for the RF source; a balun having unbalanced terminals coupled to the impedance matching circuit; a resonant antenna configured to generate plasma within the plasma chamber, the resonant antenna being a spiral resonant antenna with an electrical length corresponding to a half-wavelength of a frequency of the forward RF wave, the resonant antenna comprising: a first tap along the spiral resonant antenna coupled to a first balanced terminal of the balun, and a second tap along the spiral resonant antenna coupled to a second balanced terminal of the balun; a non-transitory memory storage comprising instructions; and a processor in communication with the non-transitory memory storage and coupled to the impedance matching circuit, wherein the instructions, when executed by the processor, cause the processor to provide a matching impedance between the RF source and the resonant antenna.

In a first implementation form of the apparatus according to the second aspect as such, the instructions, when executed by the processor, cause the processor to generate a first current flowing into the spiral resonant antenna to be equal to a second current flowing out of the spiral resonant antenna.

In a second implementation form of the apparatus according to the second aspect as such or any preceding implementation form of the second aspect, the impedance matching circuit includes a first variable capacitor arranged between the balun and the RF source; a first inductor arranged between the first balanced terminal of the balun and the first tap; a second inductor arranged between the second balanced terminal of the balun and the second tap; and a second variable capacitor arranged between the first balanced terminal of the balun and the first tap, the second variable capacitor being in series with the first inductor.

In a third implementation form of the apparatus according to the second aspect as such or any preceding implementation form of the second aspect, the impedance matching circuit includes a first variable capacitor arranged between the balun and the RF source; a first inductor arranged between the first balanced terminal of the balun and the first tap; a second inductor arranged between the second balanced terminal of the balun and the second tap; and a second variable capacitor arranged between the second balanced terminal of the balun and the second tap, the second variable capacitor being in series with the second inductor.

In a fourth implementation form of the apparatus according to the second aspect as such or any preceding implementation form of the second aspect, the spiral resonant antenna includes a first portion having an electrical length corresponding to a quarter of a wavelength of a frequency of the forward RF wave, the first portion having a first end and a second end, the first end coupled to the first balanced terminal of the balun; a second portion having an electrical length corresponding to the quarter of the wavelength of the frequency of the forward RF wave, the second portion having a first end and a second end, the first end coupled to the second balanced terminal of the balun; and a conductive coupling structure electrically coupling the first end of the first portion to the first end of the second portion.

In a fifth implementation form of the apparatus according to the second aspect as such or any preceding implementation form of the second aspect, the first portion and the second portion are arranged in a symmetrically nested configuration having a same center point.

In a sixth implementation form of the apparatus according to the second aspect as such or any preceding implementation form of the second aspect, the second end of the first portion and the second end of the second portion are coupled to a reference ground.

In a seventh implementation form of the apparatus according to the second aspect as such or any preceding implementation form of the second aspect, the second end of the first portion and the second end of the second portion are floating.

A third aspect relates to a plasma processing system. The plasma processing system includes a plasma chamber; an RF source configured to generate a forward RF wave; a balun having unbalanced terminals coupled to the RF source; an impedance matching circuit coupled to the RF source and the balun, the impedance matching circuit configured to provide matching for the RF source, the impedance matching circuit comprising: a first variable capacitor arranged between the balun and the RF source, and a first inductor, a second inductor, and a second variable capacitor arranged between the balun and the plasma chamber; and a resonant antenna configured to generate plasma within the plasma chamber, the resonant antenna comprising: a first portion having an electrical length corresponding to a quarter of a wavelength of a frequency of the forward RF wave, the first portion having a first end and a second end, the first end coupled to a first balanced terminal of the balun, a second portion having an electrical length corresponding to the quarter of the wavelength of the frequency of the forward RF wave, the second portion having a first end and a second end, the first end coupled to a second balanced terminal of the balun, and a conductive coupling structure electrically coupling the first end of the first portion to the first end of the second portion.

In a first implementation form of the plasma processing system according to the third aspect as such, the first portion and the second portion are arranged in a symmetrically nested configuration having a same center point. The second end of the first portion and the second end of the second portion are coupled to a reference ground or floating.

In a second implementation form of the plasma processing system according to the third aspect as such or any preceding implementation form of the third aspect, the impedance matching circuit and the balun are configured to generate a first current flowing through the first portion equal to a second current flowing through the second portion.

In a second implementation form of the plasma processing system according to the third aspect as such or any preceding implementation form of the third aspect, an operating frequency of the RF source is 27 megahertz (MHz).

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A plasma processing system, comprising:
a plasma chamber;
an RF source configured to generate a forward RF wave;
an impedance matching circuit coupled to the RF source, the impedance matching circuit configured to provide matching for the RF source;
a balun having unbalanced terminals coupled to the impedance matching circuit; and
a resonant antenna configured to generate plasma within the plasma chamber, the resonant antenna being a single spiral resonant antenna with an electrical length corresponding to a half-wavelength of a frequency of the forward RF wave, the resonant antenna comprising:
a first tap along the single spiral resonant antenna coupled to a first balanced terminal of the balun, and
a second tap along the single spiral resonant antenna coupled to a second balanced terminal of the balun.

2. The plasma processing system of claim 1, wherein the impedance matching circuit comprises:
a first variable capacitor arranged between the balun and the RF source;
a first inductor arranged between the first balanced terminal of the balun and the first tap;
a second inductor arranged between the second balanced terminal of the balun and the second tap; and
a second variable capacitor arranged between the first balanced terminal of the balun and the first tap, the second variable capacitor being in series with the first inductor.

3. The plasma processing system of claim 1, wherein the impedance matching circuit comprises:
a first variable capacitor arranged between the balun and the RF source;
a first inductor arranged between the first balanced terminal of the balun and the first tap;
a second inductor arranged between the second balanced terminal of the balun and the second tap; and
a second variable capacitor arranged between the second balanced terminal of the balun and the second tap, the second variable capacitor being in series with the second inductor.

4. The plasma processing system of claim 1, wherein an operating frequency of the RF source is 27 megahertz (MHz).

5. The plasma processing system of claim 1, wherein the single spiral resonant antenna comprises:
a first portion having an electrical length corresponding to a quarter of a wavelength of a frequency of the forward RF wave, the first portion having a first end and a second end, the first end coupled to the first balanced terminal of the balun;
a second portion having an electrical length corresponding to the quarter of the wavelength of the frequency of the forward RF wave, the second portion having a first end and a second end, the first end coupled to the second balanced terminal of the balun; and
a conductive coupling structure electrically coupling the first end of the first portion to the first end of the second portion.

6. The plasma processing system of claim 5, wherein the first portion and the second portion are arranged in a symmetrically nested configuration having a same center point.

7. The plasma processing system of claim 5, wherein the second end of the first portion and the second end of the second portion are coupled to a reference ground.

8. The plasma processing system of claim 5, wherein the second end of the first portion and the second end of the second portion are floating.

9. An apparatus for generating plasma in a plasma processing system, the apparatus comprising:
a plasma chamber;
an RF source configured to generate a forward RF wave;
an impedance matching circuit coupled to the RF source, the impedance matching circuit configured to provide matching for the RF source;
a balun having unbalanced terminals coupled to the impedance matching circuit;
a resonant antenna configured to generate plasma within the plasma chamber, the resonant antenna being a single spiral resonant antenna with an electrical length corresponding to a half-wavelength of a frequency of the forward RF wave, the resonant antenna comprising:
a first tap along the single spiral resonant antenna coupled to a first balanced terminal of the balun, and
a second tap along the single spiral resonant antenna coupled to a second balanced terminal of the balun;
a non-transitory memory storage comprising instructions; and
a processor in communication with the non-transitory memory storage and coupled to the impedance matching circuit, wherein the instructions, when executed by the processor, cause the processor to provide a matching impedance between the RF source and the resonant antenna.

10. The apparatus of claim 9, wherein the instructions, when executed by the processor, cause the processor to generate a first current flowing into the single spiral resonant antenna to be equal to a second current flowing out of the single spiral resonant antenna.

11. The apparatus of claim 9, wherein the impedance matching circuit comprises:
a first variable capacitor arranged between the balun and the RF source;
a first inductor arranged between the first balanced terminal of the balun and the first tap;
a second inductor arranged between the second balanced terminal of the balun and the second tap; and a second variable capacitor arranged between the first balanced terminal of the balun and the first tap, the second variable capacitor being in series with the first inductor.

12. The apparatus of claim 9, wherein the impedance matching circuit comprises:

a first variable capacitor arranged between the balun and the RF source;

a first inductor arranged between the first balanced terminal of the balun and the first tap;

a second inductor arranged between the second balanced terminal of the balun and the second tap; and a second variable capacitor arranged between the second balanced terminal of the balun and the second tap, the second variable capacitor being in series with the second inductor.

13. The apparatus of claim 9, wherein the single spiral resonant antenna comprises:

a first portion having an electrical length corresponding to a quarter of a wavelength of a frequency of the forward RF wave, the first portion having a first end and a second end, the first end coupled to the first balanced terminal of the balun;

a second portion having an electrical length corresponding to the quarter of the wavelength of the frequency of the forward RF wave, the second portion having a first end and a second end, the first end coupled to the second balanced terminal of the balun; and a conductive coupling structure electrically coupling the first end of the first portion to the first end of the second portion.

14. The apparatus of claim 13, wherein the first portion and the second portion are arranged in a symmetrically nested configuration having a same center point.

15. The apparatus of claim 13, wherein the second end of the first portion and the second end of the second portion are coupled to a reference ground.

16. The apparatus of claim 13, wherein the second end of the first portion and the second end of the second portion are floating.

17. A plasma processing system, comprising:

a plasma chamber;

an RF source configured to generate a forward RF wave;

a balun having unbalanced terminals coupled to the RF source;

an impedance matching circuit coupled to the RF source and the balun, the impedance matching circuit configured to provide matching for the RF source, the impedance matching circuit comprising:

a first variable capacitor arranged between the balun and the RF source, and a first inductor, a second inductor, and a second variable capacitor arranged between the balun and the plasma chamber; and a resonant antenna configured to generate plasma within the plasma chamber, the resonant antenna comprising:

a first portion having an electrical length corresponding to a quarter of a wavelength of a frequency of the forward RF wave, the first portion having a first end and a second end, the first end coupled to a first balanced terminal of the balun, a second portion having an electrical length corresponding to the quarter of the wavelength of the frequency of the forward RF wave, the second portion having a first end and a second end, the first end coupled to a second balanced terminal of the balun, and a conductive coupling structure electrically coupling the first end of the first portion to the first end of the second portion.

18. The plasma processing system of claim 17, wherein the first portion and the second portion are arranged in a symmetrically nested configuration having a same center point, and wherein the second end of the first portion and the second end of the second portion are coupled to a reference ground or floating.

19. The plasma processing system of claim 17, wherein the impedance matching circuit and the balun are configured to generate a first current flowing through the first portion equal to a second current flowing through the second portion.

20. The plasma processing system of claim 17, wherein an operating frequency of the RF source is 27 megahertz (MHz).

* * * * *